(12) United States Patent
Gill et al.

(10) Patent No.: US 6,183,284 B1
(45) Date of Patent: Feb. 6, 2001

(54) OPTION CARD RETAINER AND RETAINING METHOD

(75) Inventors: Stephen Gill, Round Rock; Mark S. Manley, Leander; Roy Rachui, Georgetown; Robert C. Sloan, Round Rock, all of TX (US)

(73) Assignee: Dell Computer Corporation, Round Rock, TX (US)

(*) Notice: Under 35 U.S.C. 154(b), the term of this patent shall be extended for 0 days.

(21) Appl. No.: 09/344,077

(22) Filed: Jun. 25, 1999

(51) Int. Cl.[7] .................................................... H01R 13/62
(52) U.S. Cl. ........................ 439/327; 439/366; 361/801; 211/41.17
(58) Field of Search .................................... 439/327, 325, 439/366; 361/759, 801, 809, 810, 825; 206/706; 211/41.17

(56) References Cited

U.S. PATENT DOCUMENTS

| | | | |
|---|---|---|---|
| 2,673,334 | * 3/1954 | Julian et al. | 439/353 |
| 4,006,955 | 2/1977 | Johnson . | |
| 4,124,878 | * 11/1978 | Ebner et al. | 361/415 |
| 4,198,024 | 4/1980 | Cavanna . | |
| 5,117,330 | * 5/1992 | Miazga | 361/825 |
| 5,203,022 | * 4/1993 | Finch et al. | 361/825 |
| 5,353,199 | * 10/1994 | Ohashi | 361/809 |
| 5,364,287 | * 11/1994 | Weber | 439/358 |
| 5,383,793 | 1/1995 | Hsu et al. . | |
| 5,603,628 | 2/1997 | Schapiro, Jr. . | |
| 5,726,859 | 3/1998 | Khadem et al. . | |

FOREIGN PATENT DOCUMENTS 61-182237 * 8/1986 (JP) .

* cited by examiner

*Primary Examiner*—Neil Abrams
*Assistant Examiner*—Javaid Nasri
(74) *Attorney, Agent, or Firm*—Russell D. Culbertson; Shaffer & Culbertson, LLP

(57) ABSTRACT

An option card retainer (10) includes a first elongated leg member (14) and a second elongated leg member (15). The two leg members (14, 15) are aligned with their upper ends connected by a bridge structure (16). The first leg member (14) includes a first clip structure (18) at its lower end and the second leg member (15) includes a second clip structure (19) at its lower end. A biasing device (20) is located beneath the bridge structure (16) between the first and second leg members. The retainer (10) is fastened over an option card (11) with the biasing device (20) compressed between the bridge structure (16) and a top edge (26) of the option card with the clip structures (18, 19) in a gripping engagement with an underside of the option card connector (12).

20 Claims, 3 Drawing Sheets

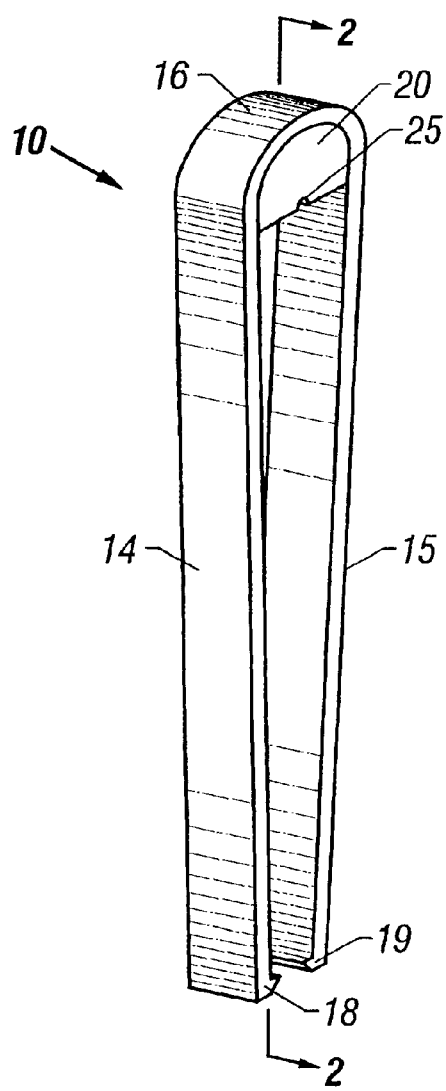
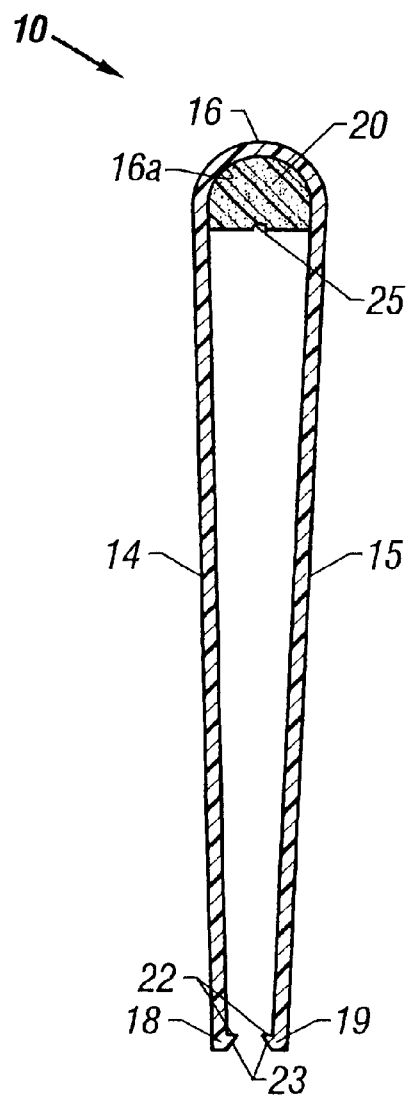
FIG. 1
FIG. 2

OPTION CARD RETAINER AND RETAINING METHOD

TECHNICAL FIELD OF THE INVENTION

This invention relates to option cards used in computer systems. More particularly, the invention includes a retainer and retaining method for securely holding an option card in a properly connected position within a computer system.

BACKGROUND OF THE INVENTION

Computer systems such as personal computers commonly include an expansion bus arrangement. PCI, ISA, and EISA are examples of expansion bus standards commonly used in personal computer systems. These expansion bus arrangements allow additional electrical components and circuitry to be added to the computer system to increase or enhance system capabilities. The additional circuitry is mounted on a printed circuit board commonly referred to as an option card (also known as an expansion card or add-on card). Option cards include a connector strip along one side of the printed circuit board. This connector strip is adapted to be received in a connector slot associated with the expansion bus. An expansion bus arrangement associated with a computer system commonly includes several option card connectors, each having a connector slot for receiving the connector strip edge of an option card.

When an option card is properly received in a slot-type option card connector, electrical pads mounted on the connector strip of the card make electrical contact with receiving elements mounted within the connector slot. The frictional engagement between the connector strip and receiving elements in the connector slot also holds the card in place. In most cases, the option card includes an additional mechanical connector at one end. This additional mechanical connector connects the option card to a frame in which the slot connector is mounted. The additional mechanical connection may be made with a screw or other fastening device, and is intended to help hold the option card in a properly connected position in the respective connector slot.

The connection between the option card connector strip and the connector slot is critical to the proper operation of the system. In the event that the connector strip becomes fully or partially dislodged from the connector slot, the option card and computer system cannot operate properly. An option card connector strip may become dislodged from its connector slot in any number of ways. In some cases, the connector strip comes loose from its connector slot as the computer system is transported or handled. Also, where the frame is misaligned with the system motherboard, mechanically connecting the option card to the frame may pull one end of the connector strip from the connector slot. Regardless of the manner in which an option card becomes dislodged, the resultant error in the computer system commonly results in a service call from the customer and may lead to customer dissatisfaction with the computer system.

Numerous devices have been developed for holding a computer system option card in place in its respective connector. A consistent shortcoming of these prior devices is that the devices required some modification to the computer system or some special structure associated with the computer system. Also, these prior option card retainer devices were cumbersome to install given the limited space available between option card connectors in the computer system.

SUMMARY OF THE INVENTION

It is an object of the invention to provide an option card retainer device which overcomes the above-described problems and others associated with retaining an option card in a properly connected position. Another object of the invention is to provide a method for retaining an option card in a properly connected position within a computer system.

An option card retainer according to the invention includes first and second elongated leg members. The upper ends of the two elongated leg members are generally aligned in a spaced apart relationship and connected together by a bridge structure. A clip structure is located at a lower end of each respective leg and includes a protuberance extending generally inwardly toward the opposite leg. The retainer also includes a biasing device. The biasing device is located beneath the bridge structure and between the upper ends of the two spaced apart leg members.

The option card retaining method according to the invention includes placing the retainer over an option card which has preferably already been properly connected in the option card connector. The retainer is placed over the card with one leg on either side of the card and the bridge structure generally centered over the top edge of the card. With the retainer in this intermediate position, the method includes applying an installation force downwardly to the top of the bridge structure to press the retainer down and compress the biasing device between the bridge structure and the top edge of the option card. The installation force presses the retainer downwardly sufficiently to allow the clip structures to move into engagement with the underside of the option card connector on either side of the connector. When the installation pressure is now released, the clip structure engagement with the underside of the option card connector prevents the biasing device from returning to an uncompressed condition. Rather, the partially compressed biasing device applies a continuous force on the retainer, pulling the clip structures into a gripping engagement with the underside of the option card connector.

In the preferred form of the invention, the legs and bridge structure are integrally formed from a somewhat resilient plastic material. The two legs are angled with respect to each other so as to converge toward their lower ends. This angled arrangement of the legs and resiliency of the leg material causes the clip structures to move to a position under the option card connector so as to engage the underside of the connector.

The preferred biasing device comprises a piece of compressible and resilient foam material secured to a lower side of the bridge structure. The foam material preferably includes an elongated indentation adapted to align with the top edge of the option card when the retainer is properly positioned over the option card.

These and other objects, advantages, and features of the invention will be apparent from the following description of the preferred embodiments, considered along with the accompanying drawings.

BRIEF DESCRIPTION OF THE DRAWINGS

FIG. 1 is a view in perspective of an option card retainer embodying the principles of the invention.

FIG. 2 is a view in section taken along line 2—2 in FIG. 1.

DESCRIPTION OF THE PREFERRED EMBODIMENTS

Figure 3:
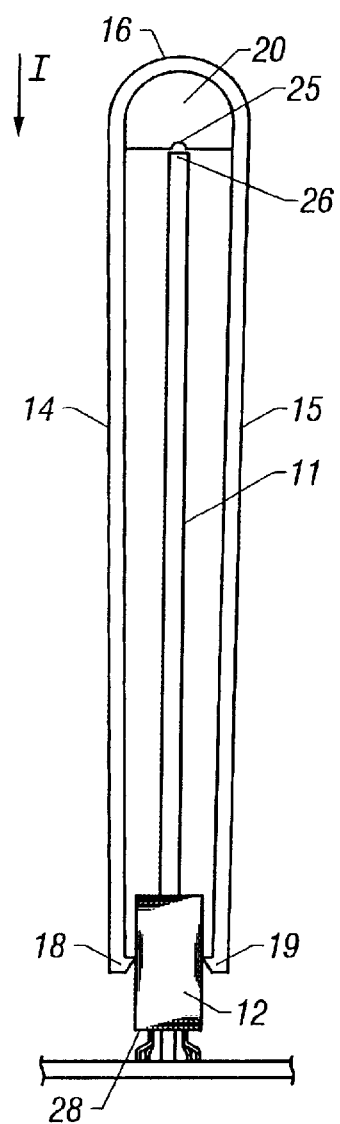
FIG. 3 is an end view of the retainer loosely positioned over an option card and option card connector.
Figure 4:
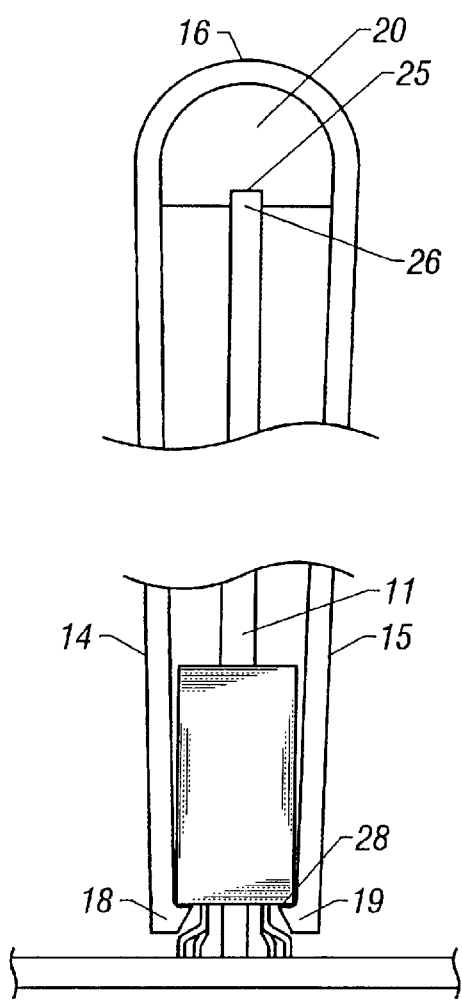
FIG. 4 is a partial end view similar to FIG. 3, but with the retainer installed over the option card and option card connector.
Figure 5:
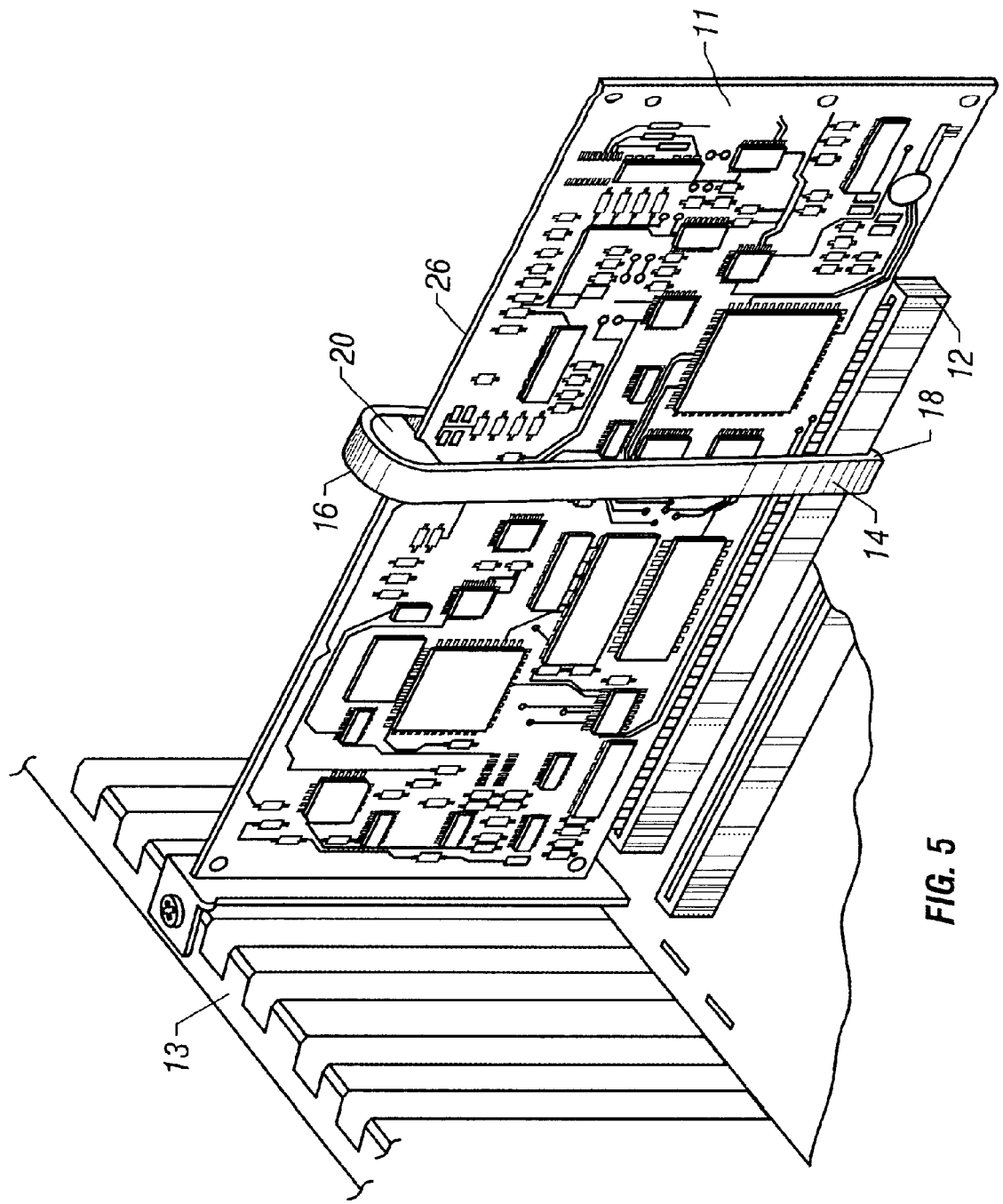
FIG. 5 is a view in perspective showing the retainer installed over the option card and option card connector in a computer system.

FIGS. 1 and 2 illustrate one preferred option card retainer 10 embodying the principles of the invention. Retainer 10 is adapted to secure an option card in an option card connector. FIGS. 4 and 5 show retainer 10 in a connected position over option card 11 and card connector 12 of computer system 13, while FIG. 3 shows the retainer in a loose, intermediate position over the option card and card connector.

The retainer 10 according to the invention is described in this disclosure and the following claims in connection with computer system option cards. These option cards may include video cards, internal modems, SCSI controller cards, and network interface cards, just to name a few examples. The invention is not limited to any particular type of option card or any particular type of expansion bus standard such as PCI, ISA, or EISA. Also, a retainer according to the invention may be used to retain devices other than computer system option cards. Specifically, the presently disclosed retainer may be used with substantially any electronic card or printed circuit board which is adapted to stand on-edge in a slot-type connector having an accessible underside surface. These electronic devices and the systems in which they are employed are to be considered equivalent to the option card and computer system shown in the figures and described in the following claims.

Referring particularly to FIGS. 1 and 2, retainer 10 includes a first elongated leg member 14 and a second elongated leg member 15. The two leg members 14 and 15 are spaced apart with their upper ends generally aligned. The two leg members 14 and 15 are connected to a bridge structure 16 and extend from a common side 16a of the bridge structure. Common side 16a comprises the lower side or surface of bridge structure 16 in FIG. 2. First leg member 14 includes a first clip structure 18 at its lower end and second leg member 15 includes a second clip structure 19 at its lower end. Retainer 10 also includes a biasing device 20 located beneath bridge structure 16 in an area between the upper ends of legs 14 and 15.

The bridge structure 16, legs 14 and 15, and clip structures 18 and 19 are all preferably formed integrally from a suitable plastic such has nylon, for example. As shown best in FIG. 2, bridge structure 16 may comprise a generally U-shaped member and leg members 14 and 15 may extend at an angle to each other and converge toward their lower ends when in a relaxed state. In this preferred arrangement, the resiliency of the material from which the bridge structure 16 and/or the leg members 14 and 15 are formed allows the legs to flex outwardly as retainer 10 is installed over the option card connector 12 (in FIGS. 3 through 5) and causes clip structures 18 and 19 to snap inwardly to facilitate the desired engagement with the option card connector as shown in FIG. 4.

Each clip structure 18 and 19 comprises a protuberance extending generally inwardly toward the opposite leg member. Each clip structure includes an upper surface 22 extending generally perpendicular to the longitudinal axis of the respective leg member. Each clip structure also preferably includes a lower beveled surface 23. The lower beveled surface 23 cooperates with the slot connector 12 (shown in FIGS. 3 through 5) to help flex the respective leg member outwardly as retainer 10 is lowered to the intermediate position shown in FIG. 3.

In the preferred form of the invention, biasing device 20 comprises a piece of resilient and compressible foam material. The foam material may be secured in place beneath bridge structure 16 with a suitable adhesive material or with any other fastening means. An elongated indentation 25 is preferably formed on the lower surface of the foam material. Indentation 25 extends along an axis located at a midpoint of the foam material and bridge structure 16, in position to receive a top edge 26 of option card 11 as retainer 10 is connected over the option card as shown in FIGS. 3 through 5. Although the simple resilient foam material comprises the preferred biasing device, other biasing arrangements such as coil or leaf spring devices may be used alternatively to the foam material. These spring devices and any other biasing device adapted to provide the biasing force between retainer 10 and option card 11 are to be considered equivalents to the foam material shown in the figures for purposes of example.

The use of retainer 10 to retain option card 11 in the desired connected position may be described with particular reference to FIGS. 3, 4, and 5. Retainer 10 is first positioned loosely over option card 11 as shown in FIG. 3. Option card 11 has previously been properly seated or connected in its respective option card connector 12. In this intermediate position, first leg member 14 extends on one side of option card 11 and second leg member 15 extends along the opposite side of the option card. Bridge structure 16 is positioned generally over the option card top edge 26. Referring to FIG. 3, when biasing device 20 is not compressed, legs 14 and 15 are not long enough for the upper surfaces 22 of the two clip structures 18 and 19 to reach the bottom surface or underside 28 of option card connector 12.

With retainer 10 in the intermediate position shown in FIG. 3, the user applies an installation force generally the direction of arrow I. This installation force compresses the foam material comprising biasing device 20 and presses retainer 10 downwardly until the upper surface 22 of each clip structure 18 and 19 reaches the underside 28 of option card connector 12. At this point, clip structures 18 and 19 snap or are otherwise moved inwardly toward each other and under option card connector 12 to engage the underside 28 of the connector. This engagement between clip structures 18 and 19 is shown best in FIG. 4. Once clip structures 18 and 19 engage the underside 28 of connector 12, the user may release the installation force. When the installation force is released, the engagement between clip structures 18 and 19 and the underside of connector 12 prevents retainer 10 from moving upwardly under the force of the compressed biasing device 20. Rather, biasing device 20 remains compressed between bridge structure 16 and the option card top edge 26. Thus, biasing device 20 continuously pushes against retainer 10, pulling clip structures 18 and 19 into a gripping engagement with the underside 28 of the option card connector 12. In this connected or installed position, shown in FIGS. 4 and 5, retainer 10 holds option card 11 down and prevents the card from coming loose from its respective connector 12.

The above described preferred embodiments are intended to illustrate the principles of the invention, but not to limit the scope of the invention. Various other embodiments and modifications to these preferred embodiments may be made by those skilled in the art without departing from the scope of the following claims.

What is claimed is:

1. An option card retainer for use with an option card comprising a circuit board having an upper elongated edge opposite an elongated edge which connects to an elongated card connector the option card retainer comprising:

(a) a first elongated leg member;

(b) a second elongated leg member;

(c) a bridge structure connecting an upper end of the first leg member to an upper end of the second member, the first and second leg members extending from a common side of the bridge structure in a spaced apart relationship with each other;

(d) a first clip structure located at a lower end of the first leg member, the first clip structure comprising a protrusion extending inwardly toward the second leg member;

(e) a second clip structure located at a lower end of the second leg member, the second clip structure comprising a protrusion extending inwardly toward the first leg member; and (f) a biasing device positioned on the common side of the bridge structure and extending from the common side of the bridge structure in an area defined between the first leg member and the second leg member, wherein the first elongated leg member extends along one side of the option card and the second elongated leg member extends along an opposite side of the option card when the bridge structure is positioned transversely over the upper edge of the option card with the biasing device contacting the upper edge of the option card, the biasing device being adapted to compress sufficiently to allow the first clip structure to engage an underside of the elongated connector at an area along a first elongated side of the connector and to allow the second clip structure to engage the underside of the elongated connector at an area along a second elongated side of the connector.

2. The retainer of claim 1 wherein the first leg member and the second leg member are each made of a resilient material and extend at an angle with respect to each other from the bridge structure so that, when the first and second leg members are in a relaxed state, each leg member converges toward the other leg member in the direction from the upper end of the respective leg member to the lower end thereof.

3. The retainer of claim 1 wherein:

(a) the first clip structure includes an upper surface extending substantially perpendicular to the longitudinal axis of the first leg member; and (b) the second clip structure includes an upper surface extending substantially perpendicular to the longitudinal axis of the second leg member.

4. The retainer of claim 1 wherein:

(a) the first clip structure includes a beveled lower inside surface facing the second leg member; and (b) the second clip structure includes a beveled lower inside surface facing the first leg member.

5. The retainer of claim 1 wherein the bridge structure, first and second leg members, and first and second clip structures are integrally formed from a plastic material.

6. The retainer of claim 1 wherein the bridge structure comprises a U-shaped member.

7. The retainer of claim 1 wherein the biasing device comprises a piece of resilient and compressible material.

8. The retainer of claim 7 wherein the resilient and compressible material comprises foam rubber.

9. The retainer of claim 7 wherein the resilient and compressible material includes an elongated indentation on a lower surface thereof, the indentation lying on an axis located generally at a midpoint of the resilient and compressible material between the upper end of the first leg member and the upper end of the second leg member.

10. A computer system having an option card installed in an option card connector, the option card comprising a circuit board, wherein the improvement comprises:

(a) a first elongated leg member having a first clip structure engaged against an underside of the option card connector on one elongated side of the option card connector, the first leg member extending along a first side of the option card;

(b) a second elongated leg member having a second clip structure engaged against the underside of the option card connector on a second elongated side of the option card connector, the second leg member extending on a side of the option card opposite to the first side;

(c) a bridge structure extending transversely over a top edge of the option card, the bridge structure connecting an upper end of the first leg member to an upper end of the second leg member; and (d) a biasing device located between the bridge structure and the top edge of the option card, the biasing device applying a biasing force between the bridge structure and the top edge of the option card, thereby pulling the first and second clip structures into a gripping engagement with the underside of the option card connector.

11. The computer system of claim 10 wherein the first clip structure is biased toward the second clip structure.

12. The computer system of claim 10 wherein:

(a) the first clip structure includes an upper surface extending substantially perpendicular to the longitudinal axis of the first leg member; and (b) the second clip structure includes an upper surface extending substantially perpendicular to the longitudinal axis of the second leg member.

13. The computer system of claim 10 wherein the first clip structure extends along an entire width of the first leg member and the second clip structure extends along an entire width of the second leg member.

14. The computer system of claim 10 wherein:

(a) the first clip structure includes a beveled lower inside surface facing the second leg member; and (b) the second clip structure includes a beveled lower inside surface facing the first leg member.

15. The computer system of claim 10 wherein the bridge structure, first and second leg members, and first and second clip structures are integrally formed from a plastic material.

16. The computer system of claim 10 wherein the biasing device comprises a piece of resilient and compressible material.

17. The computer system of claim 16 wherein the resilient and compressible material comprises foam rubber.

18. The computer system of claim 16 wherein the resilient and compressible material includes an elongated indentation on a lower surface thereof, the indentation having the top edge of the option card received therein.

19. A method for retaining an option card in an option card connector, the option card comprising a circuit board, and the method comprising the steps of:

(a) placing a retainer transversely over the card received in the card connector with a first elongated leg member of the retainer extending along a first side of the card and a first clip structure at a lower end of the first leg member positioned at a first elongated side of the card connector, and with a second elongated leg member of the retainer extending along a second side of the card and a second clip structure at a lower end of the second leg member positioned at a second elongated side of the card connector;

(b) applying an installation pressure to compress a biasing device between a bridge structure and a top edge of the option card, the bridge structure connecting the first and second elongated leg members;
(c) engaging the first clip structure with an underside of the card connector;
(d) engaging the second clip structure with the underside of the card connector; and
(e) releasing the installation pressure, leaving the biasing device partially compressed and applying a gripping force to the first and second leg members, the gripping force pulling the first and second clip structures into a gripping engagement with the underside of the card connector.

20. The method of claim 19 wherein the step of placing the retainer over the option card includes the step of:
(a) aligning the top edge of the option card with an elongated indentation associated with the biasing device.

* * * * *